(12) United States Patent
Yamane et al.

(10) Patent No.: US 8,194,443 B2
(45) Date of Patent: Jun. 5, 2012

(54) MEMORY DEVICE AND MEMORY

(75) Inventors: Kazutaka Yamane, Kanagawa (JP);
Masanori Hosomi, Kanagawa (JP);
Hiroshi Kano, Kanagawa (JP);
Hiroyuki Ohmori, Kanagawa (JP);
Minoru Ikarashi, Kanagawa (JP);
Tetsuya Yamamoto, Kanagawa (JP);
Kazuhiro Bessho, Kanagawa (JP);
Yutaka Higo, Kanagawa (JP); Yuki Oishi, Kanagawa (JP); Shinichiro Kusunoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 58 days.

(21) Appl. No.: 12/796,802

(22) Filed: Jun. 9, 2010

(65) Prior Publication Data

US 2010/0314673 A1    Dec. 16, 2010

(30) Foreign Application Priority Data

Jun. 16, 2009   (JP) ............................... P2009-143678

(51) Int. Cl.
*G11C 11/14* (2006.01)

(52) U.S. Cl. ........ 365/171; 365/148; 365/158; 365/173; 977/933; 977/935

(58) Field of Classification Search ................... 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 428/810–816, 817–825.1, 428/826; 438/3; 977/933–935

See application file for complete search history.

(56) References Cited

U.S. PATENT DOCUMENTS

| | | | |
|---|---|---|---|
| 6,256,223 B1 | 7/2001 | Sun | |
| 6,845,038 B1 * | 1/2005 | Shukh | ........................... 365/171 |
| 6,956,766 B2 | 10/2005 | Nakamura et al. | |
| 7,576,956 B2 * | 8/2009 | Huai | ........................... 360/324.2 |
| 7,663,171 B2 | 2/2010 | Inokuchi et al. | |
| 7,675,129 B2 * | 3/2010 | Inomata et al. | ............... 257/421 |
| 7,989,223 B2 * | 8/2011 | Inomata et al. | ................... 438/3 |
| 2002/0163766 A1 * | 11/2002 | Eguchi et al. | ............ 360/324.12 |

(Continued)

FOREIGN PATENT DOCUMENTS

JP    2003-17782    1/2003

(Continued)

OTHER PUBLICATIONS

Nikkei Electronics, pp. 164-171, Feb. 12, 2001 (part 1 of 2).

(Continued)

*Primary Examiner* — Richard Elms
*Assistant Examiner* — Harry W Byrne
(74) *Attorney, Agent, or Firm* — K&L Gates LLP

(57) ABSTRACT

A memory device includes: a memory layer that retains information based on a magnetization state of a magnetic material, a first intermediate layer and a second intermediate layer that are provided to sandwich the memory layer and are each formed of an insulator, a first fixed magnetic layer disposed on an opposite side of the first intermediate layer from the memory layer, a second fixed magnetic layer disposed on an opposite side of the second intermediate layer from the memory layer, and a nonmagnetic conductive layer provided between either the first intermediate layer or the second intermediate layer and the memory layer, the memory device being configured so that spin-polarized electrons are injected thereinto in a stacking direction to change the magnetization direction of the memory layer, thereby storing information in the memory layer.

20 Claims, 4 Drawing Sheets

U.S. PATENT DOCUMENTS

| | | | |
|---|---|---|---|
| 2006/0018057 A1* | 1/2006 | Huai | 360/324.2 |
| 2006/0044703 A1* | 3/2006 | Inomata et al. | 360/324.1 |
| 2006/0077707 A1* | 4/2006 | Deak | 365/171 |
| 2009/0180308 A1* | 7/2009 | Inomata et al. | 365/145 |

FOREIGN PATENT DOCUMENTS

| | | |
|---|---|---|
| JP | 2004-193595 | 7/2004 |
| JP | 2006-269530 | 10/2006 |

OTHER PUBLICATIONS

Nikkei Electronics, pp. 164-171, Feb. 12, 2001 (English Translation part 2 of 2).

PHYs. Rev. 6,54.,9353 (1996).

J. Magn. Mat., 159.,L1 (1996).

* cited by examiner

MEMORY DEVICE AND MEMORY

CROSS REFERENCES TO RELATED APPLICATIONS

The present application contains subject matter related to that disclosed in Japanese Priority Patent Application JP 2009-143678 filed in the Japan Patent Office on Jun. 16, 2009, the entire contents of which is hereby incorporated by reference.

BACKGROUND

The present application relates to a memory device including a memory layer which uses the magnetization state of a ferromagnetic layer to store information and a fixed magnetic layer whose magnetization direction is fixed. The memory device is configured so that a current is applied thereto to change the magnetization direction of the memory layer. The application also relates to a memory including the memory device. The application is suitable for the application to a nonvolatile memory.

A high-speed, high-density DRAM has been widely used as a random access memory in information equipment, such as a computer.

However, a DRAM is a volatile memory that loses stored information when the power is turned off, and thus a nonvolatile memory that retains the stored information has been desired.

As possible nonvolatile memories, attention is focused on magnetoresistive random access memories (MRAMs) that use the magnetization of a magnetic material to store information, which have been under development (see, e.g., Nikkei Electronics, No. 2001-2-12 (pp. 164 to 171)).

In an MRAM, current is passed through two kinds of addressing wires arranged at substantially right angles to each other (a word line and a bit line). The current magnetic field generated from each addressing wire reverses the magnetization of a magnetic layer of the magnetic memory device disposed at the intersection of the addressing wires, whereby information is stored in the magnetic layer.

FIG. 6 shows a schematic diagram (perspective view) of an ordinary MRAM.

In a region isolated by an element isolation layer 102 on a semiconductor base 110 such as a silicon substrate, a drain region 108, a source region 107, and a gate electrode 101 are formed to provide a selection transistor for selecting a memory cell.

Above the gate electrode 101, a word line 105 is provided to extend in the anteroposterior direction in the figure.

The drain region 108 is common between right and left selection transistors in the figure, and a wire 109 is connected to the drain region 108.

Further, a magnetic memory device 103 is disposed between the word line 105 and a bit line 106 provided thereabove to extend in the horizontal direction in the figure. The magnetic memory device 103 has a memory layer whose magnetization direction is to be reversed. A magnetic tunnel junction element (MTJ element) may be used to form the magnetic memory device 103, for example.

Further, the magnetic memory device 103 is electrically connected to the source region 107 via a horizontal bypass line 111 and a vertical contact layer 104.

A current is passed through each of the word line 105 and the bit line 106. As a result, a current magnetic field is applied to the magnetic memory device 103, whereby the magnetization direction of the memory layer of the magnetic memory device 103 is reversed to allow information to be stored therein.

In order for stored information to be stably retained in a magnetic memory such as an MRAM, a magnetic layer to store the information (memory layer) is required to have certain coercivity.

Meanwhile, for rewriting the stored information, it is necessary to pass a certain amount of current through the addressing wires.

However, as MRAM-forming elements decrease in size, the current value needed to reverse magnetization has been increasing, whereas because of thinner addressing wires, it is getting more difficult to pass a sufficient current therethrough.

Accordingly, memories that use magnetization reversal by spin injection have been attracting attention as memories that enable magnetization reversal at lower current (see, e.g., JP-A-2003-17782; U.S. Pat. No. 6,256,223 specification; PHYs. Rev. B, 54., 9353, (1996); and J. Magn. Mat., 159., L1, (1996)).

Magnetization reversal by spin injection represents a process in which electrons spin-polarized through a magnetic material are injected into a different magnetic material to thereby cause magnetization reversal in the different magnetic material.

For example, by passing a current through a giant magnetoresistance element (GMR element) or a magnetic tunnel junction element (MTJ element) in the direction perpendicular to the film plane, the magnetization direction of at least one of the magnetic layers in the element can be reversed.

Magnetization reversal by spin injection is advantageous in that even in a minute element, magnetization reversal can be achieved without the need for increased current.

FIGS. 7 and 8 show schematic diagrams of such a memory that uses magnetization reversal by spin injection. FIG. 7 is a perspective view, and FIG. 8 is an sectional view.

In a region isolated by an element isolation layer 52 on a semiconductor base 60 such as a silicon substrate, a drain region 58, a source region 57, and a gate electrode 51 are formed to provide a selection transistor for selecting a memory cell. The gate electrode 51 also serves as a word line that extends in the anteroposterior direction in FIG. 7.

The drain region 58 is common between right and left selection transistors in FIG. 7, and a wire 59 is connected to the drain region 58.

Further, a memory device 53 is disposed between the source region 57 and a bit line 56 provided thereabove to extend in the horizontal direction in FIG. 7. The memory device 53 has a memory layer whose magnetization direction is to be reversed by spin injection.

A magnetic tunnel junction element (MTJ element) may be used to form the memory device 53, for example. The reference numerals 61 and 62 indicate magnetic layers. Of the two magnetic layers 61 and 62, one magnetic layer serves as a fixed magnetic layer having a fixed magnetization direction, while the other magnetic layer serves as a free magnetic layer whose magnetization direction is variable, i.e., a memory layer.

The memory device 53 is connected to the bit line 56 and the source region 57 via upper and lower contact layers 54, respectively. Accordingly, a current can be passed through the memory device 53 to reverse the magnetization direction of the memory layer by spin injection.

In the case of such a memory that uses magnetization reversal by spin injection, as compared with the ordinary MRAM shown in FIG. 6, the device structure can be simplified, whereby higher density can be achieved.

Further, as compared with magnetization reversal using an external magnetic field as in ordinary MRAMs, magnetization reversal by spin injection also provides an advantage in that the write current is not increased even when the device decreases in size.

Incidentally, in an MRAM, write lines (word lines and bit lines) are provided separately from memory devices. A current is passed through the write lines, and the thus-generated current magnetic field is used to write (store) information. Therefore, a sufficient amount of current required for writing can be passed through the write lines.

In a memory that uses magnetization reversal by spin injection, a current is passed through a memory device to achieve spin injection and thereby reverse the magnetization direction of a memory layer.

Because a current is directly passed through memory devices in this way to write (store) information, for the selection of a memory cell for writing, each memory device is connected to a selection transistor to form a memory cell. In such a case, the current passed through the memory device is limited by the magnitude of current that can be passed through the selection transistor (the saturation current of the selection transistor).

Therefore, it is necessary to write at a current not more than the saturation current of the selection transistor, and it thus is necessary to improve the spin injection efficiency to reduce the current passed through the memory device.

Further, in order to increase a readout signal, it is necessary to ensure a high magnetoresistance change ratio. For this purpose, a memory device configured to have tunnel insulating layers (tunnel barrier layers) as intermediate layers on the opposite sides of a memory layer is effective.

However, in such a case where tunnel insulating layers are used as intermediate layers, in order to prevent the tunnel insulating layers from dielectric breakdown, the amount of current passed through the memory device is limited. In these respects, it will be necessary to (1) ensure a high magnetoresistance change ratio, (2) suppress the spin injection current, and (3) increase the breakdown voltage of the memory device.

A possible measure to suppress the spin injection current to meet one of the above conditions is to apply a dual-pin structure to a memory device, in which two fixed magnetic layers are positioned above and below a memory layer with intermediate layers therebetween, respectively.

In connection with such a dual-pin structure, for the purpose of suppressing the spin injection current, a structure has been proposed in which ferromagnetic layers of the two fixed magnetic layers closest to the respective intermediate layers have magnetization directions antiparallel to each other (see, e.g., JP-A-2004-193595 and JP-A-2006-269530).

SUMMARY

With respect to a memory device configured to allow the magnetization direction of its memory layer to be reversed by spin injection, in order for such a memory device to form a memory, it is necessary to (1) ensure a high magnetoresistance change ratio, (2) suppress the spin injection current, and (3) increase the breakdown voltage of the memory device.

In reducing the current required for magnetization reversal by spin injection to thereby suppress the spin injection current, it is effective to use a memory device in which fixed magnetic layers having magnetization directions antiparallel to each other are positioned above and below a storage material as described in the above JP-A-2004-193595.

However, in the case where simple intermediate layers are employed as in the above JP-A-2004-193595 or JP-A-2006-269530, the magnetoresistance effects through the upper and lower intermediate layers cancel each other, causing problems in that this reduces the effective resistance change, etc.

It thus is difficult to simultaneously satisfy the above conditions (1) to (3).

Under the circumstance, there is a need for providing a memory device that makes it possible to ensure a high magnetoresistance change ratio, suppress the spin injection current, and also increase the breakdown voltage; and a memory including the memory device.

A memory device according to one embodiment includes a memory layer that retains information based on the magnetization state of a magnetic material; and a first intermediate layer and a second intermediate layer that are provided to sandwich the memory layer and are each formed of an insulator. The memory device further includes a first fixed magnetic layer disposed on the opposite side of the first intermediate layer from the memory layer; a second fixed magnetic layer disposed on the opposite side of the second intermediate layer from the memory layer; and a nonmagnetic conductive layer provided between either the first intermediate layer or the second intermediate layer and the memory layer. The memory device is configured so that spin-polarized electrons are injected thereinto in the stacking direction to change the magnetization direction of the memory layer, thereby storing information in the memory layer.

A memory device according to another embodiment includes a memory layer that uses retains information based on the magnetization state of a magnetic material; and a first intermediate layer and a second intermediate layer that are provided to sandwich the memory layer and are each formed of an insulator. The memory device further includes a first fixed magnetic layer disposed on the opposite side of the first intermediate layer from the memory layer; and a second fixed magnetic layer disposed on the opposite side of the second intermediate layer from the memory layer. The memory device also includes a nonmagnetic conductive layer provided either between the first intermediate layer and the first fixed magnetic layer or between the second intermediate layer and the second fixed magnetic layer. The memory device is configured so that spin-polarized electrons are injected thereinto in the stacking direction to change the magnetization direction of the memory layer, thereby storing information in the memory layer.

A memory according to still another embodiment includes a memory device having the configuration of the one embodiment and wires that supply current to the memory device in the stacking direction.

A memory according to yet another embodiment the application includes a memory device having the configuration of the another embodiment and wires that supply current to the memory device in the stacking direction.

In the memory device according to the one embodiment, the first intermediate layer and the second intermediate layer each formed of an insulator are provided to sandwich the memory layer. As a result, the voltage is divided between the two intermediate layers (insulators), and the breakdown voltage of the memory device can thus be increased.

Further, the first fixed magnetic layer and the second fixed magnetic layer are each provided on the opposite side of the corresponding intermediate layer from the memory layer. This improves the spin injection efficiency, reducing the current to reverse the magnetization of the memory layer. As a result, the current passed through the memory device to store information by spin injection can be suppressed.

Further, the nonmagnetic conductive layer is provided between either the first intermediate layer or the second intermediate layer and the memory layer. This creates a large difference in resistance between the two magnetoresistive elements given by the intermediate layers. As a result, even when the magnetoresistance effects of the two magnetoresistive elements cancel each other, sufficiently large magnetoresistance remains, and it thus is possible to ensure a high magnetoresistance change ratio in the entire memory device.

In the memory device according to the another embodiment, the first intermediate layer and the second intermediate layer each formed of an insulator are provided to sandwich the memory layer. As a result, the voltage is divided between the two intermediate layers (insulators), and the breakdown voltage of the memory device can thus be increased.

Further, the first fixed magnetic layer and the second fixed magnetic layer are each provided on the opposite side of the corresponding intermediate layer from the memory layer. This improvise the spin injection efficiency, reducing the current to reverse the magnetization of the memory layer. As a result, the current passed through the memory device to store information by spin injection can be suppressed.

Further, the nonmagnetic conductive layer is provided either between the first intermediate layer and the first fixed magnetic layer or between the second intermediate layer and the second fixed magnetic layer. This creates a large difference in resistance between the two magnetoresistive elements given by the intermediate layers. As a result, even when the magnetoresistance effects of the two magnetoresistive elements cancel each other, sufficiently large magnetoresistance remains, and it thus is possible to ensure a high magnetoresistance change ratio in the entire memory device.

In the memory according to the still another embodiment, the memory device has the configuration of the one embodiment. Therefore, a high magnetoresistance change ratio can be ensured in the memory device, the current passed through the memory device can be suppressed, and the breakdown voltage of the memory device can be increased.

In the memory according to the yet another embodiment, the memory device has the configuration of the another embodiment. Therefore, a high magnetoresistance change ratio can be ensured in the memory device, the current passed through the memory device can be suppressed, and the breakdown voltage of the memory device can be increased.

According to the an embodiment, a high magnetoresistance change ratio can be ensured in the memory device, the current passed through the memory device to store information therein can be suppressed, and also the breakdown voltage of the memory device can be increased. As a result, the memory device can be provided with an excellent balance of properties.

This thus realizes a highly reliable memory that operates stably.

Further, the current passed through the memory device to store information therein can be reduced, whereby the power consumption for storing information in the memory device can be reduced.

Therefore, the power consumption of the entire memory can be reduced.

Additional features and advantages are described herein, and will be apparent from the following Detailed Description and the figures.

DETAILED DESCRIPTION

Figure 1:
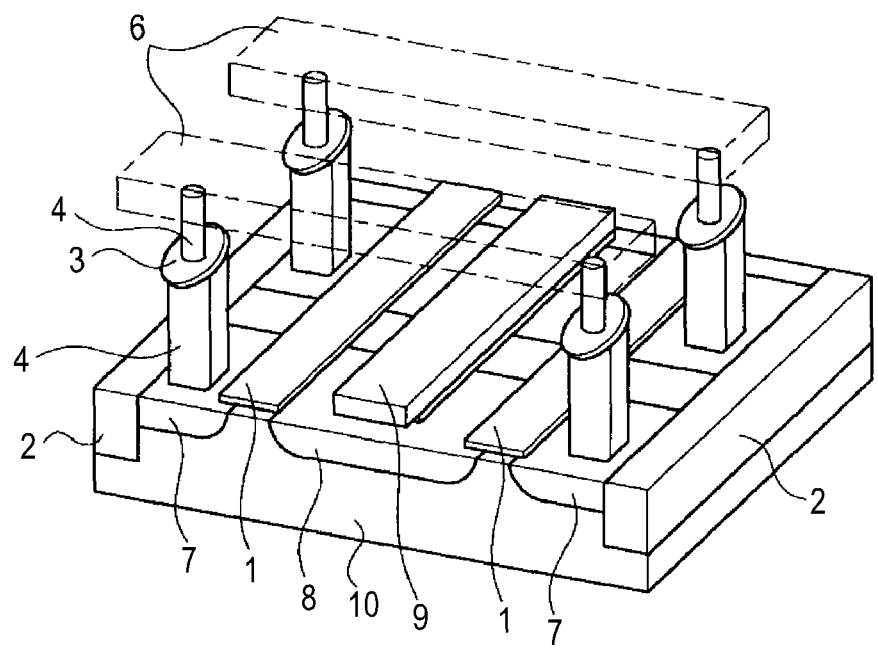
FIG. 1 is a schematic block diagram (perspective view) of a memory according to a first embodiment.

The present application is described below in greater detail with reference to the drawings according to an embodiment.

Hereinafter, preferred modes for carrying out the application (hereinafter referred to as embodiments) will be explained.

Explanations will be given in the following order.
1. Outline of the Application
2. First Embodiment
3. Second Embodiment
4. Alternative Embodiments
5. Experiments 1. Outline of the Application First, before explaining specific embodiments, an outline the application will be described.

According to an embodiment, the magnetization direction of a memory layer of a memory device is reversed by spin injection to store information therein. The memory layer is formed of a magnetic material such as a ferromagnetic layer, and uses the magnetization state (the magnetization direction) of the magnetic material to retain information.

The fundamental operation to reverse the magnetization direction of a magnetic layer by spin injection is as follows. A current not less than a certain threshold is passed through a memory device formed of a giant magnetoresistive element (GMR element) or a tunnel magnetoresistive element (MTJ element) in the direction perpendicular to the film plane. At this time, the polarity (direction) of the current depends on the magnetization direction reversed.

When a current having an absolute value smaller than the threshold is passed therethrough, magnetization reversal does not occur.

The current threshold Ic required to reverse the magnetization of a magnetic layer by spin injection is represented by the following formula (1).

$$Ic = A \cdot \alpha \cdot M_s \cdot V \cdot Hd / 2\eta \quad (1)$$

In the formula, A is a constant, $\alpha$ is the spin damping constant, $\eta$ is the spin injection efficiency, Ms is the saturation magnetization of the memory layer, V is the volume of the memory layer, and Hd is the effective demagnetizing field.

As shown in the formula (1), the current threshold can be arbitrarily set by controlling the magnetic layer volume V, the magnetic layer saturation magnetization Ms, the spin injection efficiency $\eta$, and the spin damping constant $\alpha$.

The memory device including a magnetic layer (memory layer) capable of storing information based on the magnetization state and a fixed magnetic layer having a fixed magnetization direction is thus provided.

The memory layer is required to be capable of retaining the written information so as to form a memory. As an index of the ability to retain information, the value of a thermal stability index ($kV/K_BT$) is employed. The $KV/K_BT$ is represented by the following formula (2).

$$KV/k_BT = Ms \cdot V \cdot H_k \cdot (1/2k_BT) \qquad (2)$$

In the formula, $H_k$ is the effective anisotropy field, $k_B$ is the Boltzmann constant, T is the temperature, Ms is the saturation magnetization, and V is the volume of the memory layer.

The effective anisotropy field $H_k$ is under the influence of shape magnetic anisotropy, induced magnetic anisotropy, magnetocrystalline anisotropy, etc., and, assuming a single-domain coherent rotation model, is equivalent to the coercive force.

Generally, retaining stored information at 85° C. for ten years requires a $KV/K_BT$ value of 60 or more. In many cases, there is a tradeoff between Ic and $KV/K_BT$, and the balance between the two is often presents a problem in maintaining the properties of a memory.

In reality, the current threshold to change the magnetization state of a memory layer is as follows. In an approximately elliptical TMR element with a 100 nm×150 nm plane pattern including a 2-nm-thick memory layer, the positive threshold +Ic is +0.65 mA, and the negative threshold −Ic is 0.5 mA. The current density then is about $5 \times 10^6$ A/cm$^2$. These are in close agreement with the above formula (1).

In contrast, in an ordinary MRAM that uses a current magnetic field to reverse magnetization, a write current of several milliamperes or more is required.

Thus, in the case of magnetization reversal by spin injection, the threshold of the write current is smaller, and this is apparently effective in reducing the power consumption of an integrated circuit.

Further, unlike an ordinary MRAM, the wiring for generating a current magnetic field (105 in FIG. 6) is not required, and, therefore, the application is advantageous over the ordinary MRAM also in terms of integration degree.

Because a current is directly passed through memory devices in this way to write (store) information, for the selection of a memory cell for writing, each memory device is connected to a selection transistor to form a memory cell. In such a case, the current passed through the memory device is limited by the magnitude of current that can be passed through the selection transistor (the saturation current of the selection transistor).

The above JP-A-2004-193595 and JP-A-2006-269530 propose the reduction of the data write current by providing a memory device with a structure in which two fixed magnetic layers are positioned above and below a memory layer with intermediate layers therebetween, respectively, and the fixed layers adjoining the respective intermediate layers have magnetization directions antiparallel to each other.

However, in the case of using simple intermediate layers as in the above JP-A-2004-193595 or JP-A-2006-269530, the magnetoresistance effects through the upper and lower intermediate layers cancel each other, causing problems in that this reduces the effective resistance change, etc. It thus is difficult to ensure a high magnetoresistance change ratio, suppress the spin injection current, and increase the breakdown voltage of the memory device; that is, it is difficult to give a memory device having an excellent balance of properties.

According to an embodiment, there is provided that a structure including fixed magnetic layers positioned above and below a memory layer with intermediate layers of insulators therebetween, respectively, in which at least either of the upper and lower intermediate layers is provided with a nonmagnetic conductive layer.

Such a structure makes it possible to ensure a high magnetoresistance change ratio, suppress the spin injection current, and increase the breakdown voltage of the memory device; therefore, a memory device having an excellent balance of properties can be realized.

Considering the saturation current of a selection transistor, a tunnel insulating layer of an insulator is used as the intermediate layer not provided with a nonmagnetic conductive layer, forming a magnetic tunnel junction (MTJ) element together with the memory layer.

In particular, magnesium oxide (MgO) is used as the material for the tunnel insulating layer. This results in a higher magnetoresistance change ratio (MR ratio) than in the case of using aluminum oxide that has been generally used.

With respect to the intermediate layer provided with a nonmagnetic conductive layer, although a spin torque is transmitted thereto, the magnetoresistance thereof is extremely small due to the presence of the nonmagnetic conductive layer.

Further, in particular, when the intermediate layer not provided with a nonmagnetic conductive layer has higher tunneling resistance than that of the intermediate layer provided with a nonmagnetic conductive layer, this can further increases the output of the resistance change by magnetoresistance. For example, the intermediate layer not provided with a nonmagnetic conductive layer may be formed using a material with higher resistance than that of the material for the intermediate layer provided with a nonmagnetic conductive layer. Alternatively, using the same material, the intermediate layer not provided with a nonmagnetic conductive layer may be formed thicker than the intermediate layer provided with a nonmagnetic conductive layer.

According to the embodiment, one intermediate layer is provided with a nonmagnetic conductive layer, forming a laminated structure, while only a tunnel insulating layer is used as the other intermediate layer. This provides a higher magnetoresistance change ratio (MR ratio) as compared with the case of a magnetic tunnel junction (MTJ) element in which simple tunnel insulating layers are used for the intermediate layers or a giant magnetoresistive (GMR) element in which spacers are used for the intermediate layers. Because of the increased magnetoresistance change ratio, the readout signal intensity can be increased.

As materials for the nonmagnetic conductive layer that forms a laminated structure with an intermediate layer, Ru, Os, Re, Ir, Au, Ag, Cu, Al, Bi, B, C, Cr, Ta, Pd, Pt, Zr, Hf, W, Mo, Nb, and alloys thereof are usable.

In this embodiment, two intermediate layers of insulators (tunnel insulating layers) exist in one memory device, and this provides a voltage-dividing effect. Therefore, as compared with a memory device having only one tunnel insulating layer, the dielectric breakdown voltage is greatly increased.

With respect to the tunnel insulating layer of a magnesium oxide (MgO) film, it is more preferable that such a MgO film is crystallized and maintains the crystal orientation in the direction 001.

Moreover, when magnesium oxide is used to form an intermediate layer, an annealing temperature as high as 300° C. or more, preferably 340° C. to 360° C., is generally desired to achieve excellent MR properties. Such a temperature is above the annealing temperature range for aluminum oxide that has been generally used to form intermediate layers (250° C. to 280° C.).

This is probably because such annealing is necessary to encourage the phase separation between the oxide and a ferromagnetic layer to thereby form a coherent interface, and also to provide a tunnel barrier layer of magnesium oxide or the like with a proper inner structure or crystal structure.

Therefore, it is difficult to obtain excellent MR properties unless a heat-resistant, ferromagnetic material is used also for a ferromagnetic layer of the memory device so that the ferromagnetic layer withstands such high-temperature annealing.

In order to obtain a current density necessary to reverse the magnetization direction of the memory layer by spin injection, the sheet resistivity of the tunnel insulating layer is controlled to about several tens $\Omega\mu m^2$ or less.

With respect to the tunnel insulating layer of a MgO film, in order for the sheet resistivity to be within the above range, the thickness of the MgO film should be 1.5 nm or less.

Further, the memory device is preferably so small that the magnetization direction of the memory layer can be reversed readily at a low current.

Therefore, the memory device preferably has an area of $0.04\ \mu m^2$ or less.

The fixed magnetic layers and the memory layer preferably have a unidirectional anisotropy.

Further, the fixed magnetic layers and the memory layer each preferably have a thickness of 1 nm to 30 nm.

In other respects, the configuration of the memory device may be the same as the known configuration of a memory device that stores information using spin injection.

The fixed magnetic layers positioned above and below the memory layer each have its magnetization direction fixed by only a ferromagnetic layer or by using antiferromagnetic coupling between an antiferromagnetic layer and a ferromagnetic layer.

Each fixed magnetic layer may be a single ferromagnetic layer or may alternatively have a laminated ferrimagnetic structure including a plurality of ferromagnetic layers stacked with a nonmagnetic layer therebetween.

The fixed magnetic layer of the laminated ferrimagnetic structure has reduced sensitivity to an external magnetic field. Therefore, unwanted changes in the magnetization of the fixed magnetic layer caused by the external magnetic field can be suppressed, stabilizing the operation of the memory device. Further, the thickness of each ferromagnetic layer can be adjusted, and the stray magnetic field from the fixed magnetic layer can be suppressed.

Co, CoFe, CoFeB, and the like are usable as materials for the ferromagnetic layers forming the fixed magnetic layer of a laminated ferrimagnetic structure. Ru, Re, Ir, Os, and the like are usable as materials for the nonmagnetic layer.

In the upper fixed magnetic layer and the lower fixed magnetic layer above and below the memory layer, it is preferable that among the ferromagnetic layers forming the fixed magnetic layers, ferromagnetic layers closest to the respective intermediate layers have magnetization directions antiparallel to each other. When the magnetization directions of such ferromagnetic layers are antiparallel to each other, this results in higher spin injection efficiency than in the case where the directions are parallel to each other.

The magnetization directions of the ferromagnetic layers of the two fixed magnetic layers closest to the respective intermediate layer may be adjusted to run antiparallel to each other. For example, one fixed magnetic layer is formed of an odd number of ferromagnetic layers, while the other fixed magnetic layer is formed of an even number of fixed magnetic layers, and an antiferromagnetic layer is positioned on the opposite side of each fixed magnetic layer from the memory layer and the corresponding intermediate layer. Then, the upper and lower, two antiferromagnetic layers are simultaneously annealed in a magnetic field so that a magnetic field in one direction is applied thereto, whereby ferromagnetic layers of the fixed magnetic layers closest to the respective antiferromagnetic layers have magnetization directions parallel to each other. As a result, ferromagnetic layers of the fixed magnetic layers closest to the respective intermediate layers have magnetization directions antiparallel to each other.

As materials for the antiferromagnetic layers, FeMn alloys, PtMn alloys, PtCrMn alloys, NiMn alloys, IrMn alloys, NiO, $Fe_2O_3$, and like magnetic materials can be mentioned.

Further, nonmagnetic elements such as Ag, Cu, Au, Al, Si, Bi, Ta, B, C, O, N, Pd, Pt, Zr, Hf, Ir, W, Mo, and Nb may be added to the magnetic materials. This enables the adjustment of magnetic properties and other physical properties including the crystal structure, the crystallinity, the substance stability, etc.

Information stored in the memory layer of the memory device may be read out as follows. Specifically, a magnetic layer to serve as a reference for data may be provided on the memory layer of the memory device via a thin insulating film so as to read information using a ferromagnetic tunneling current through the insulating layer. Information may also be read out using magnetoresistance.

2. First Embodiment

Specific embodiments will be described hereinafter.

FIG. 1 is a schematic block diagram (perspective view) of a memory according to a first embodiment.

The memory has a memory device near the intersection of two kinds of addressing wires arranged at right angles to each other (e.g., a word line and a bit line). The memory device is capable of retaining information based on a magnetization state.

That is, in a region isolated by an element isolation layer 2 on a semiconductor base 10 such as a silicon substrate, a drain region 8, a source region 7, and a gate electrode 1 are formed to provide a selection transistor for selecting a memory cell. The gate electrode 1 also serves as an addressing wire (e.g., a word line) that extends in the anteroposterior direction in the figure.

The drain region 8 is common between right and left selection transistors in the figure, and a wire 9 is connected to the drain region 8.

Further, a memory device 3 is disposed between the source region 7 and the other addressing wire (e.g., a bit line) 6 provided thereabove to extend in the horizontal direction in the figure. This memory device 3 has a memory layer formed of a ferromagnetic layer whose magnetization direction is to be reversed by spin injection.

The memory device 3 is disposed near the intersection of the two kinds of addressing wires 1 and 6.

The memory device 3 is connected to the bit line 6 and the source region 7 via upper and lower contact layers 4, respectively.

Accordingly, current can be supplied to the memory device 3 through the two kinds of addressing wires 1 and 6. A current in the vertical direction (the stacking direction of the memory device 3) can be passed through the memory device 3 to reverse the magnetization direction of the memory layer by spin injection.

Figure 2:
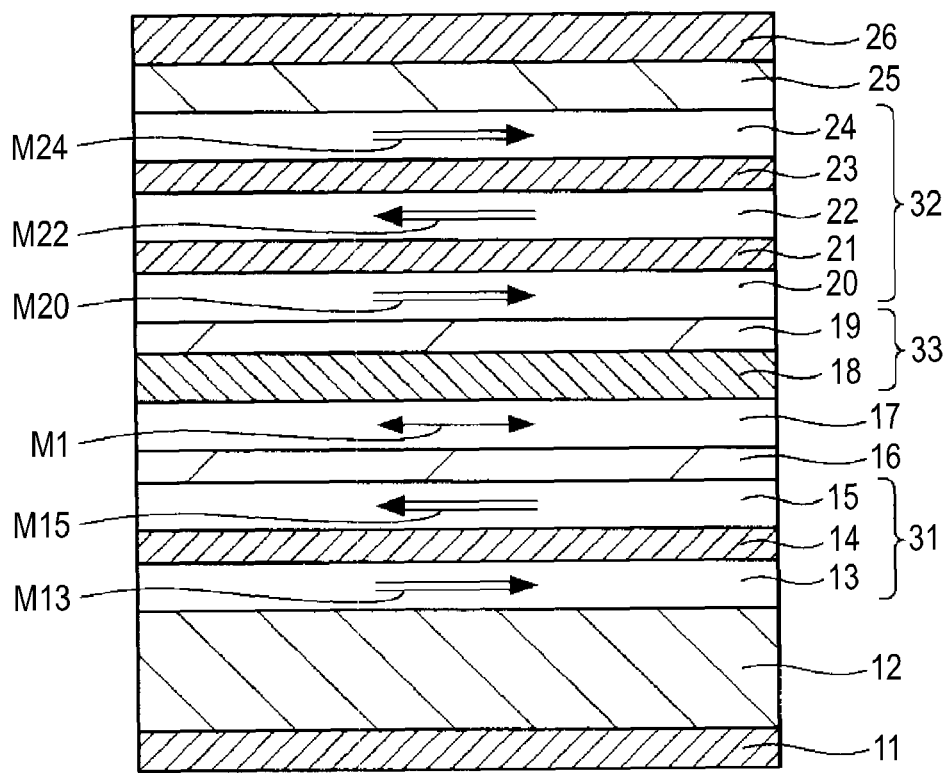
FIG. 2 shows a cross section of a memory device shown in FIG. 1.

FIG. 2 shows a cross section of the memory device 3 of the memory of this embodiment.

As shown in FIG. 2, the memory device 3 has fixed magnetic layers 31 and 32 positioned above and below a memory layer 17, respectively. The magnetization direction M1 of the memory layer is reversed by spin injection. An antiferromagnetic layer 12 is provided under the first fixed magnetic layer 31, a lower layer. The antiferromagnetic layer 12 fixes the magnetization direction of the first fixed magnetic layer 31. An antiferromagnetic layer 25 is provided on the second fixed magnetic layer 32, an upper layer. The antiferromagnetic layer 25 fixes the magnetization direction of the second fixed magnetic layer 32.

An insulating layer (first intermediate layer) 16 that serves as a tunnel barrier layer (tunnel insulating layer) is provided between the memory layer 17 and the lower, first fixed magnetic layer 31. Further, an insulating layer (first intermediate layer) 19 that serves as a tunnel barrier layer (tunnel insulating layer) is provided between the memory layer 17 and the upper, second fixed magnetic layer 32.

An underlayer 11 is formed under the antiferromagnetic layer 12, and a cap layer 26 is formed on the antiferromagnetic layer 25.

The two fixed magnetic layers 31 and 32 each have a laminated ferrimagnetic structure.

Specifically, the first fixed magnetic layer 31 has a structure in which two ferromagnetic layers 13 and 15 are stacked with a nonmagnetic layer 14 therebetween, and antiferromagnetically coupled. The second fixed magnetic layer 32 has a structure in which three ferromagnetic layers 20, 22, and 24 are stacked with nonmagnetic layers 21 and 23 therebetween, and antiferromagnetically coupled.

Since the ferromagnetic layers 13 and 15 of the first fixed magnetic layer 31 are in a laminated ferrimagnetic structure, the magnetization M13 of the ferromagnetic layer 13 is oriented to the right, while the magnetization M15 of the ferromagnetic layer 15 is oriented to the left; they are thus oppositely oriented. Accordingly, the fluxes from the ferromagnetic layers 13 and 15 of the first fixed magnetic layer 31 cancel each other.

Since the ferromagnetic layers 20, 22, and 24 of the second fixed magnetic layer 32 are in a laminated ferrimagnetic structure, the magnetization M20 of the ferromagnetic layer 20 is oriented to the right, the magnetization M22 of the ferromagnetic layer 22 is oriented to the left, and the magnetization M24 of the ferromagnetic layer 24 is oriented to the left; they are thus oppositely oriented. Accordingly, the fluxes from the ferromagnetic layers 20, 22, and 24 of the second fixed magnetic layer 32 cancel one another.

The memory device 3 of this embodiment particularly includes a nonmagnetic conductive layer 18 between the insulating layer (second intermediate layer) 19 above the memory layer 17 and the memory layer 17, and has a laminated structure 33 including the nonmagnetic conductive layer 18 and the insulating layer 19, forming an MTJ (magnetic tunnel coupling) element.

As materials for the nonmagnetic conductive layer 18, the above-mentioned Ru, Os, Re, Ir, Au, Ag, Cu, Al, Bi, B, C, Cr, Ta, Pd, Pt, Zr, Hf, W, Mo, Nb, and alloys thereof are usable.

The memory device 3 of this embodiment can be produced by successively forming layers from the underlayer 11 to the cap layer 26 in a vacuum device, and then forming the pattern of the memory device 3 by etching, etc.

According to the above embodiment, the nonmagnetic conductive layer 18 is positioned between the insulating layer (second intermediate layer) 19 above the memory layer 17 and the memory layer 17. This creates a large difference in resistance between the two magnetoresistive elements given by the insulating layers (intermediate layers) 16 and 19. Therefore, even when the magnetoresistance effects of two magnetoresistive elements cancel each other, sufficiently large magnetoresistance remains, and it thus is possible to ensure a high magnetoresistance change ratio in the entire memory device 3.

Further, the insulating layer (first intermediate layer) 16 is positioned below the memory layer 17, and the insulating layer (second intermediate layer) 19 is positioned above the memory layer 17. As a result, the voltage is divided between the two insulating layers 16 and 19 to increase the breakdown voltage of the memory device 3.

Further, the first fixed magnetic layer 31 and the second fixed magnetic layer 32 are positioned above and below the memory layer 17 with the intermediate layers 16 and 19 therebetween, respectively. This improves the spin injection efficiency, reducing the current to reverse the magnetization of the memory layer 17. As a result, the current passed through the memory device 3 to store information therein by spin injection can be suppressed.

In particular, because the magnetization M15 of the ferromagnetic layer 15 of the first fixed magnetic layer 31 closest to the insulating layer 16 is oriented antiparallel to the magnetization M20 of the ferromagnetic layer 20 of the second fixed magnetic layer 32 closest to the insulating layer 19, this results in a higher spin injection efficiency as compared with the case where the directions are parallel to each other.

Further, the memory device 3 of the embodiment has sufficient heat resistance, and resists annealing at 340° C. to 360° C. without losing its magnetic properties.

This provides an advantage in that the ordinary semiconductor MOS formation process can be employed in the production of a memory equipped with the memory device 3. The memory equipped with the memory device 3 according to the embodiment can be thus applied as a general-purpose memory.

In addition, in this embodiment, when the insulating layers 16 and 19 serving as intermediate layers are magnesium oxide layers, this allows an increase in the magnetoresistance change ratio (MR ratio).

Such an increase in the MR ratio also serves to improve the spin injection efficiency, thereby reducing the current density required to reverse the direction of the magnetization M1 of the memory layer 17.

According to this embodiment, a high magnetoresistance change ratio can be ensured in the memory device 3, the current passed through the memory device 3 to store information therein can be suppressed, and also the breakdown voltage of the memory device 3 can be increased. As a result, the memory device 3 can be provided with an excellent balance of properties.

This thus realizes a highly reliable memory that operates stably.

Further, because the current passed through the memory device 3 to store information therein by spin injection can be suppressed, the power consumption for storing information in the memory device 3 can be reduced.

As a result, with respect to a memory having memory cells formed of memory devices 3 according to this embodiment, the power consumption of the entire memory can be reduced.

This thus realizes a highly reliable memory that operates stably with excellent information-retaining properties. Also, in a memory equipped with the memory device 3, a reduction in power consumption can be achieved.

3. Second Embodiment

Figure 3:
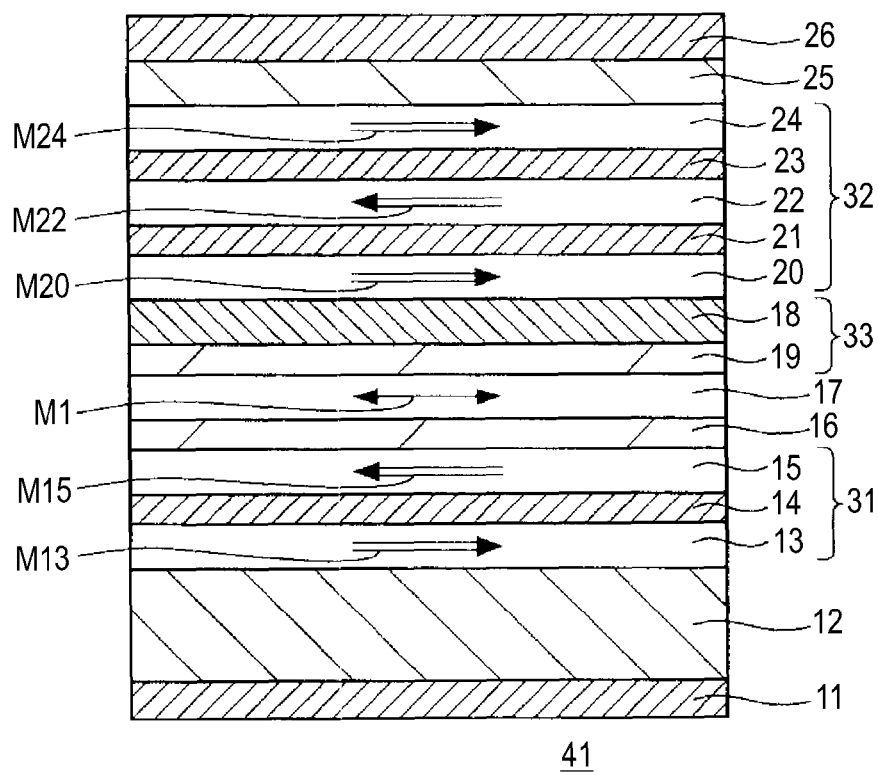
FIG. 3 shows a cross section of a memory device according to a second embodiment.

FIG. 3 shows a cross section of a memory device according to a second embodiment.

As shown in FIG. 3, a memory device 41 of this embodiment particularly includes a nonmagnetic conductive layer 18 between an insulating layer (second intermediate layer) 19 above a memory layer 17 and a second fixed magnetic layer 32, and has a laminated structure 33 including the insulating layer 19 and the nonmagnetic conductive layer 18.

In this embodiment, as materials for the nonmagnetic conductive layer 18, the above-mentioned Ru, Os, Re, Ir, Au, Ag, Cu, Al, Bi, B, C, Cr, Ta, Pd, Pt, Zr, Hf, W, Mo, Nb, and alloys thereof are also usable.

In other respects, the memory device 41 is configured in the same manner as the memory device 3 of the first embodiment shown in FIG. 2. The same components are indicated by the same numerals and will not be further described.

A memory as shown in FIG. 1 can also be formed using the memory device 41 of this embodiment.

According to this embodiment, the nonmagnetic conductive layer 18 is positioned between the insulating layer (second intermediate layer) 19 above the memory layer 17 and the second fixed magnetic layer 32. This creates a large difference in resistance between the two magnetoresistive elements given by the insulating layers 16 and 19. Therefore, even when the magnetoresistance effects of two magnetoresistive elements cancel each other, sufficiently large magnetoresistance remains, and it thus is possible to ensure a high magnetoresistance change ratio in the entire memory device 41.

Further, as in the case of the memory device 3 of the first embodiment, a first fixed magnetic layer 31 and the second fixed magnetic layer 32 are positioned above and below the memory layer 17 with the insulating layers 16 and 19 therebetween, respectively. As a result, the current passed through the memory device 41 to store information therein can be suppressed.

Further, as in the case of the memory device 3 of the first embodiment, the insulating layer (first intermediate layer) 16 is positioned below the memory layer 17, and the insulating layer (second intermediate layer) 19 is positioned above the memory layer 17. As a result, the breakdown voltage of the memory device 41 can be increased.

According to this embodiment, a high magnetoresistance change ratio can be ensured in the memory device 41, the current passed through the memory device 41 to store information therein can be suppressed, and also the breakdown voltage of the memory device 41 can be increased. As a result, the memory device 41 can be provided with an excellent balance of properties.

This thus realizes a highly reliable memory that operates stably.

Further, because the current passed through the memory device 41 to store information therein by spin injection can be suppressed, the power consumption for storing information in the memory device 41 can be reduced.

As a result, with respect to a memory having memory cells formed of memory devices 41 according to this embodiment, the power consumption of the entire memory can be reduced.

This thus realizes a highly reliable memory that operates stably with excellent information-retaining properties. Also, in a memory equipped with the memory device 41, a reduction in power consumption can be achieved.

4. Alternative Embodiments

Figure 4:
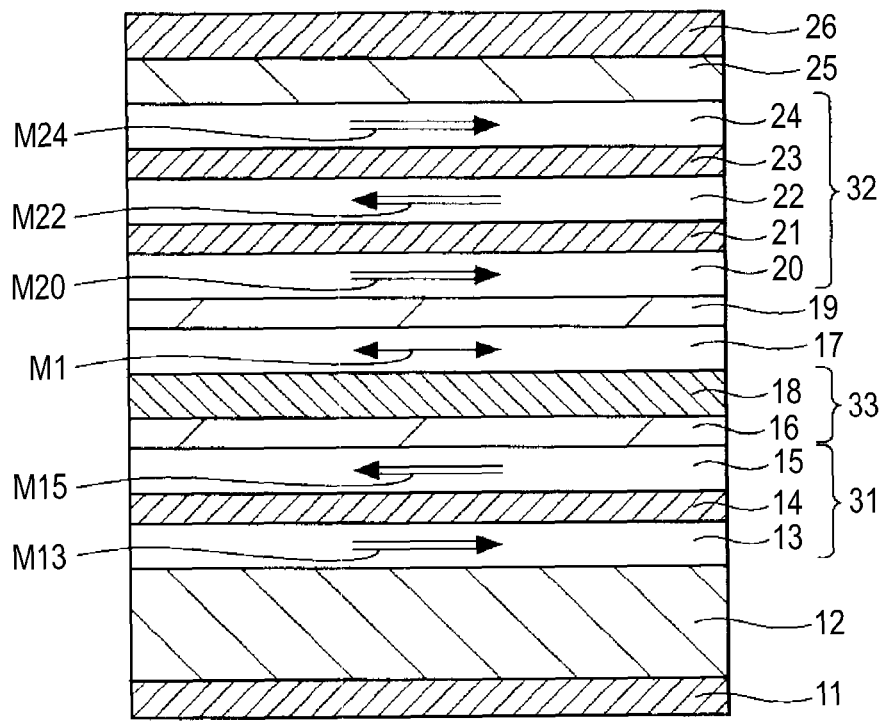
FIG. 4 shows a cross section of a memory device according to an alternative mode of the first embodiment shown in FIG. 2.

FIG. 4 shows a cross section of a memory device according to a modified embodiment of the memory device 3 of the first embodiment shown in FIG. 2.

A memory device 42 shown in FIG. 4 has a nonmagnetic conductive layer 18 between an insulating layer (first intermediate layer) 16 below a memory layer 17 and the memory layer 17, forming a laminated structure 33 including the insulating layer 16 and the nonmagnetic conductive layer 18. An insulating layer 19 above the memory layer 17 is a single insulating layer 19. That is, the memory device 42 is different from the memory device 3 of the first embodiment shown in FIG. 2 in that the position of the nonmagnetic conductive layer 18 is changed from above the memory layer 17 to below.

In other respects, the memory device 42 is configured in the same manner as the memory device 3 of the first embodiment shown in FIG. 2, and the same components will not be further described.

In the memory device 42 shown in FIG. 4, the nonmagnetic conductive layer 18 is positioned between the insulating layer (first intermediate layer) 16 below the memory layer 17 and the memory layer 17, and, therefore, like the memory device 3 of the first embodiment shown in FIG. 2, a high magnetoresistance change ratio can be ensured.

Figure 5:
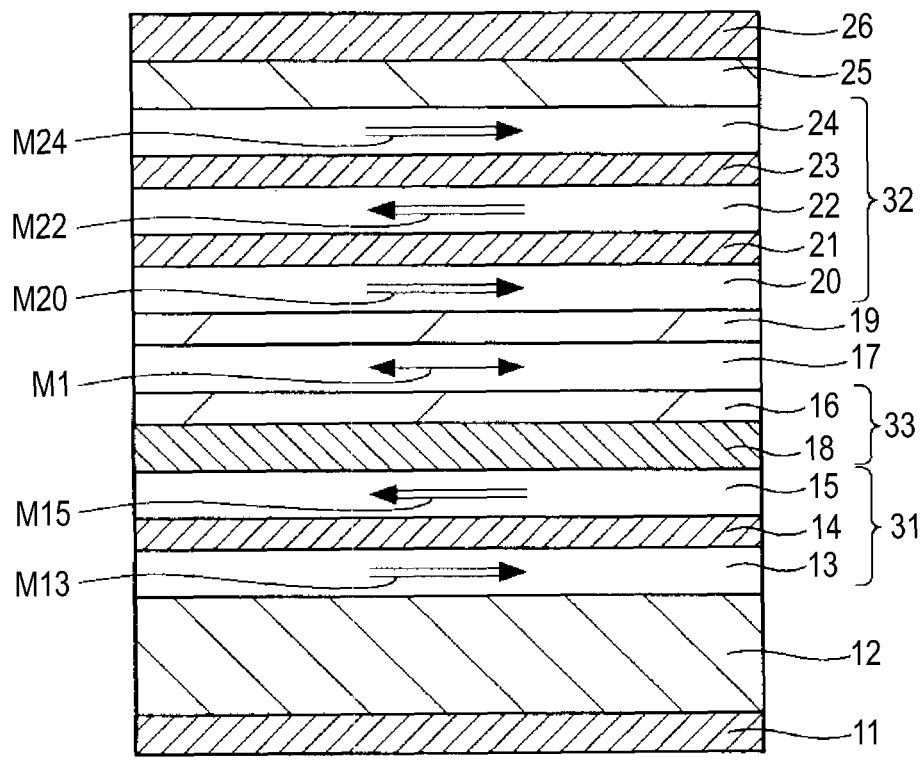
FIG. 5 shows a cross section of a memory device according to an alternative mode of the second embodiment shown in FIG. 3.

FIG. 5 shows a cross section of a memory device according to a modified embodiment of the memory device 41 of the second embodiment shown in FIG. 3.

A memory device 43 shown in FIG. 5 has a nonmagnetic conductive layer 18 between an insulating layer 16 below a memory layer 17 and a first magnetic fixed layer 31, forming a laminated structure 33 including the insulating layer 16 and the nonmagnetic conductive layer 18. An insulating layer 19 above the memory layer 17 is a single insulating layer 19. That is, the memory device 43 is different from the memory device 41 of the second embodiment shown in FIG. 3 in that the position of the nonmagnetic conductive layer 18 is changed from above the memory layer 17 to below.

In other respects, the memory device 43 is configured in the same manner as the memory device 41 of the second embodiment shown in FIG. 3, and the same components will not be further described.

In the memory device 43 shown in FIG. 5, the nonmagnetic conductive layer 18 is positioned between the insulating layer 16 below the memory layer 17 and a first fixed magnetic layer 31, and, therefore, like the memory device 41 of the second embodiment shown in FIG. 3, a high magnetoresistance change ratio can be ensured.

According to the above embodiments and alternative embodiments, the magnetization M15 of the ferromagnetic layer 15 of the first fixed magnetic layer 31 closest to the insulating layer 16 is oriented antiparallel to the magnetization M20 of the ferromagnetic layer 20 of the second fixed magnetic layer 32 closest to the insulating layer 19.

The application is not limited to the cases where among the ferromagnetic layers forming the fixed magnetic layers positioned above and below the memory layer, ferromagnetic layers closest to the respective intermediate layers (insulating layers) have magnetization directions antiparallel to each other. The application is also applicable to the cases where the magnetization directions of such ferromagnetic layers are parallel to each other.

As mentioned above, when the magnetization directions of such ferromagnetic layers are antiparallel to each other, this results in higher spin injection efficiency than in the case where the directions are parallel to each other.

According to the above embodiments, the first fixed magnetic layer 31 has a two-layer laminated ferrimagnetic structure, and the second fixed magnetic layer 32 has a three-layer laminated ferrimagnetic structure.

However, for example, it is also possible that one fixed magnetic layer is a single ferromagnetic layer and the other fixed magnetic layer has a two-layer laminated ferrimagnetic structure, so that ferromagnetic layers of the two fixed magnetic layers closest to the respective intermediate layers have magnetization directions antiparallel to each other.

In the memory devices according to the an embodiment, as long as ferromagnetic layers of the fixed magnetic layers closest to the respective intermediate layers (insulating layers) have magnetization directions antiparallel to each other, the number of ferromagnetic layers forming the first fixed magnetic layer or the second fixed magnetic layer is not be limited.

Further, as mentioned above, when one fixed magnetic layer has an odd number of ferromagnetic layers and the other fixed magnetic layer has an even number of ferromagnetic layers, by annealing the antiferromagnetic layers in a magnetic field, the magnetization directions of ferromagnetic layers of the fixed magnetic layers closest to the respective intermediate layers can be oriented antiparallel to each other.

5. Experiments

The properties of memory devices according to an embodiment were examined.

Figure 6:
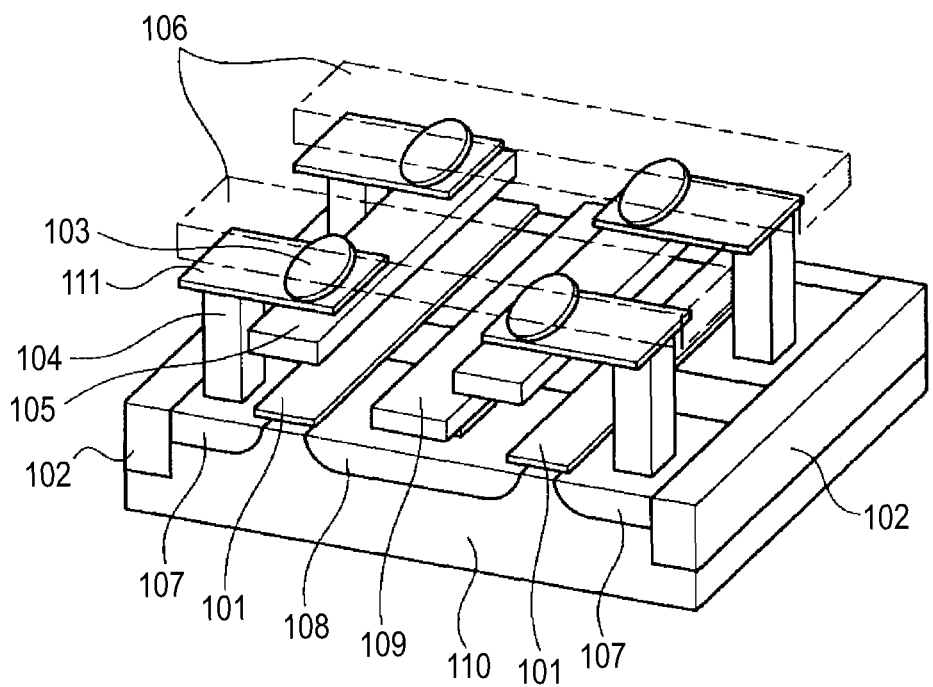
FIG. 6 is a perspective view schematically showing the configuration of a known MRAM.
Figure 7:
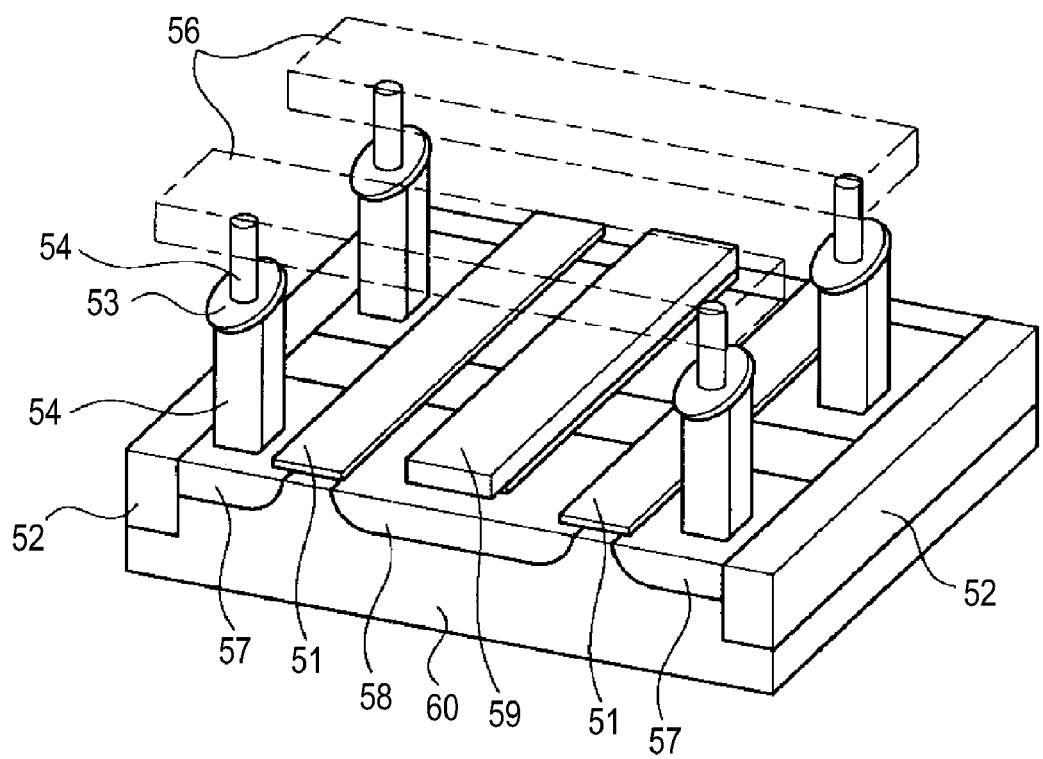
FIG. 7 is a schematic block diagram (perspective view) of a memory that uses magnetization reversal by spin injection.
Figure 8:
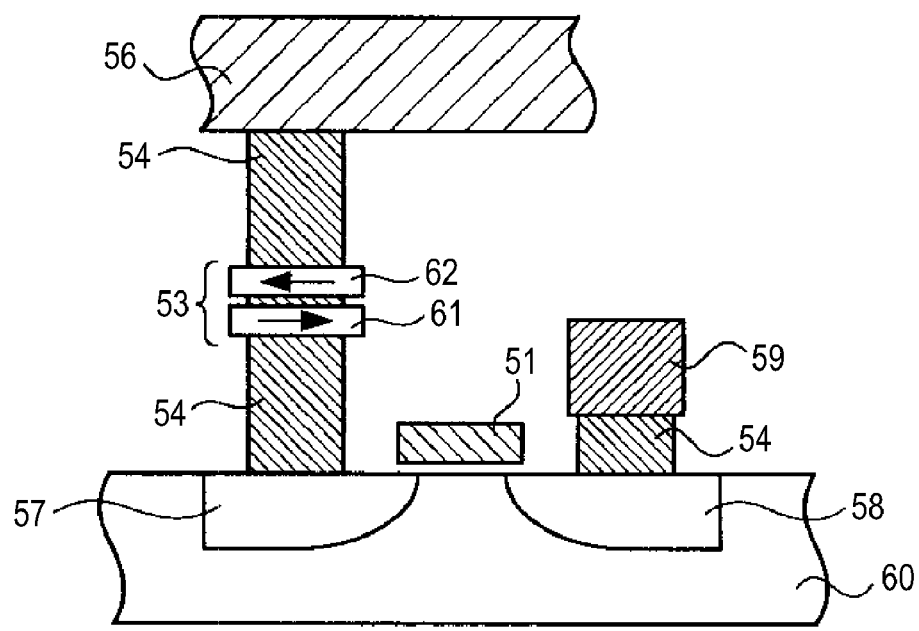
FIG. 8 shows a cross section of the memory of FIG. 7.

In reality, in addition to the memory device, a memory also includes a semiconductor circuit for switching and the like as shown in FIG. 1, FIG. 6, and FIG. 7. However, for the purpose of examining the magnetoresistance properties of a memory layer, wafers having formed thereon only memory devices were studied herein.

Example 1

A 300-nm-thick thermally oxidized film was formed on a 0.725-mm-thick silicon substrate, and a memory device 3 configured as shown in FIG. 2 was formed thereon.

Specifically, in the memory device 3 configured as shown in FIG. 2, the material and thickness of each layer were as shown in the Film Structure 1 given below. That is, a Ta film having a thickness of 10 nm was employed as the underlayer 11, and a PtMn film having a thickness of 20 nm as the antiferromagnetic layer 12. A CoFe film having a thickness of 2 nm, a Ru film having a thickness of 0.8 nm, and a CoFeB film having a thickness of 2.5 nm were employed as the ferromagnetic layer 13, the nonmagnetic layer 14, and the ferromagnetic layer 15 forming the first fixed magnetic layer 31, respectively. A magnesium oxide film having a thickness of 0.9 nm was employed as the insulating layer (barrier layer) 16 to serve as a tunnel insulating layer. A CoFeB film having a thickness of 2 nm was employed as the memory layer 17, a Ru film having a thickness of 0.5 nm as the nonmagnetic conductive layer 18, and a magnesium oxide film having a thickness of 0.7 nm as the insulating layer 19. A CoFeB film having a thickness of 2.5 nm, a Ru film having a thickness of 0.8 nm, a CoFe film having a thickness of 4 nm, a Ru film having a thickness of 0.8 nm, and a CoFe film having a thickness of 2 nm were employed as the ferromagnetic layer 20, the nonmagnetic layer 21, the ferromagnetic layer 22, the nonmagnetic layer 23, and the ferromagnetic layer 24 forming the second fixed magnetic layer 32, respectively. A PtMn film having a thickness of 20 nm was employed as the antiferromagnetic layer 25, and a Ta film having a thickness of 5 nm as the cap layer 26. Between the underlayer 11 and the antiferromagnetic layer 12, a non-illustrated Cu film having a thickness of 100 nm (to serve as the below-mentioned word line) was provided. The composition of the CoFeB films as the memory layer 17 and the ferromagnetic layers 15 and 20 was Co40Fe20B (at %), the composition of the PtMn films as the antiferromagnetic layers 12 and 25 was Pt50Mn50 (at %), and the composition of the CoFe films as the ferromagnetic layers 13, 22, and 24 was Co90Fe10 (at %).

The layers of the memory device 3 were thus formed.

Film Structure 1:

Ta(10)/Cu(100)/PtMn(20)/CoFe(2)/Ru(0.8)/CoFeB(2.5)/ MgO(0.9)/CoFeB(2)/Ru(0.5)/MgO(0.7)/CoFeB (2.5)/Ru (0.8)/CoFe(4)/Ru(0.8)/CoFe(2)/PtMn(20)/Ta (5) (Unit: nm)

Layers other than the insulating layers 16 and 19 of magnesium oxide films were formed by DC magnetron sputtering.

The insulating layers 16 and 19 of magnesium oxide (MgO) films were formed by RF magnetron sputtering.

Further, after the layers of the memory device 3 were formed, the memory device 3 was annealed in a field anneal furnace in a magnetic field of 10 kOe at 360° C. for 2 hours to apply to an ordering heat treatment to the PtMn films as the antiferromagnetic layers 12 and 25.

Subsequently, a portion to form a word line was masked using photolithography so that other regions of the multilayer film were selectively etched with Ar plasma; a word line (lower electrode) was thus formed. The regions other than the word line portion were etched to a depth of 5 nm into the substrate.

Subsequently, an electron-beam writing system was employed to form a mask defining the pattern of the memory device 3, and the multilayer film was selectively etched to form the memory device 3. Regions other than the memory device 3 were etched to a depth just above the Cu layer serving as the word line.

In a memory device for property evaluation, a sufficient current for a memory device has to be passed therethrough to generate spin torque necessary for magnetization reversal, and it thus is necessary to suppress the resistance of the tunnel insulating layers. The pattern of the memory device 3 was thus designed to have an elliptical shape with a minor axis of 0.09 μm×a major axis of 0.18 μm, so that the memory device 3 had a sheet resistivity ($\Omega\mu m^2$) of 20 $\Omega\mu m^2$.

Subsequently, $Al_2O_3$ was deposited to a thickness of about 100 nm by spattering to insulate the regions other than the memory device 3 portion.

A bit line to serve as the upper electrode and a pad for measurement were then formed using photolithography.

A sample of the memory device 3 of Example 1 was produced.

Example 2

A 300-nm-thick thermally oxidized film was formed on a 0.725-mm-thick silicon substrate, and a memory device 41 configured as shown in FIG. 3 was formed thereon.

Specifically, in the memory device 41 configured as shown in FIG. 3, the material and thickness of each layer were as shown in the Film Structure 2 given below. That is, a Ta film having a thickness of 10 nm was employed as the underlayer 11, and a PtMn film having a thickness of 20 nm as the antiferromagnetic layer 12. A CoFe film having a thickness of 2 nm, a Ru film having a thickness of 0.8 nm, and a CoFeB film having a thickness of 2.5 nm were employed as the ferromagnetic layer 13, the nonmagnetic layer 14, and the ferromagnetic layer 15 forming the first fixed magnetic layer 31, respectively. A magnesium oxide film having a thickness of 0.9 nm was employed as the insulating layer (barrier layer) 16 to serve as a tunnel insulating layer. A CoFeB film having a thickness of 2 nm was employed as the memory layer 17, a magnesium oxide film having a thickness of 0.7 nm as the insulating layer 19, and a Ru film having a thickness of 0.5 nm as the nonmagnetic conductive layer 18. A CoFeB film having a thickness of 2.5 nm, a Ru film having a thickness of 0.8 nm, a CoFe film having a thickness of 4 nm, a Ru film having a thickness of 0.8 nm, and a CoFe film having a thickness of 2 nm were employed as the ferromagnetic layer 20, the nonmagnetic layer 21, the ferromagnetic layer 22, the nonmagnetic layer 23, and the ferromagnetic layer 24 forming the second fixed magnetic layer 32, respectively. A PtMn film having a thickness of 20 nm was employed as the antiferromagnetic layer 25, and a Ta film having a thickness of 5 nm as the cap layer 26. Between the underlayer 11 and the antiferromagnetic layer 12, a non-illustrated Cu film having a thickness of 100 nm (to serve as the below-mentioned word line) was provided. The composition of the CoFeB films as the memory layer 17 and the ferromagnetic layers 15 and 20 was Co40Fe20B (at %), the composition of the PtMn films as the antiferromagnetic layers 12 and 25 was Pt50Mn50 (at %), and the composition of the CoFe films as the ferromagnetic layers 13, 22, and 24 was Co90Fe10 (at %).

The layers of the memory device 41 were thus formed.

The subsequent processes were the same as in Example 1. The memory device 41 of Example 2 was thus obtained.

Film Structure 2:

Ta(10)/Cu(100)/PtMn(20)/CoFe(2)/Ru(0.8)/CoFeB (2.5)/MgO(0.9)/CoFeB2)/MgO(0.7)/Ru(0.5)/CoFeB (2.5)/Ru(0.8)/CoFe(4)/Ru(0.8)/CoFe(2)/PtMn(20)/Ta (5) (Unit: nm)

Comparative Example 1

Following the configuration of the memory device 3 of Example 1, layers from the underlayer 11 to the memory layer 17 were formed. A cap layer 26 was then formed just above the memory layer 17 to give a sample of a comparative example. The material and thickness of each layer were as shown in the Film Structure 3 given below. That is, a Ta film having a thickness of 10 nm was employed as the underlayer 11, and a PtMn film having a thickness of 20 nm as the antiferromagnetic layer 12. A CoFe film having a thickness of 2 nm, a Ru film having a thickness of 0.8 nm, and a CoFeB film having a thickness of 2.5 nm were employed as the ferromagnetic layer 13, the nonmagnetic layer 14, and the ferromagnetic layer 15 forming the fixed magnetic layer 31, respectively. A magnesium oxide film having a thickness of 1.0 nm was employed as the insulating layer (barrier layer) 16 to serve as a tunnel insulating layer. A CoFeB film having a thickness of 2 nm was employed as the memory layer 17, and a Ta film having a thickness of 5 nm as the cap layer 26. Between the underlayer 11 and the antiferromagnetic layer 12, a non-illustrated Cu film having a thickness of 100 nm (to serve as the below-mentioned word line) was provided.

The layers of the memory device were thus formed.

The subsequent processes were the same as in Example 1. The memory device of Comparative Example 1 was thus obtained.

Film Structure 3:

Ta(10)/Cu(100)/PtMn(20)/CoFe(2)/Ru(0.8)/CoFeB (2.5)/MgO(1.0)/CoFeB(2)/Ta(5) (Unit: nm)

Comparative Example 2

The laminated structure 33 including the upper intermediate layer (the nonmagnetic conductive layer 18 and the insulating layer 19) of the memory device 3 of Example 1 was replaced with a Cu film having a thickness of 4 nm to give a sample of Comparative Example 2. The material and thickness of each layer were as shown in the Film Structure 4 given below. That is, a Ta film having a thickness of 10 nm was employed as the underlayer 11, and a PtMn film having a thickness of 20 nm as the antiferromagnetic layer 12. A CoFe film having a thickness of 2 nm, a Ru film having a thickness of 0.8 nm, and a CoFeB film having a thickness of 2.5 nm were employed as the ferromagnetic layer 13, the nonmagnetic layer 14, and the ferromagnetic layer 15 forming the first fixed magnetic layer 31, respectively. A magnesium oxide film having a thickness of 0.9 nm was employed as the insulating layer (barrier layer) 16 to serve as a tunnel insulating layer. A CoFeB film having a thickness of 2 nm was employed as the memory layer 17, and a Cu film having a thickness of 4 nm was formed thereon. A CoFeB film having a thickness of 2.5 nm, a Ru film having a thickness of 0.8 nm, a CoFe film having a thickness of 4 nm, a Ru film having a thickness of 0.8 nm, and a CoFe film having a thickness of 2 nm were employed as the ferromagnetic layer 20, the nonmagnetic layer 21, the ferromagnetic layer 22, the nonmagnetic layer 23, and the ferromagnetic layer 24 forming the second fixed magnetic layer 32, respectively. A PtMn film having a thickness of 20 nm was employed as the antiferromagnetic layer 25, and a Ta film having a thickness of 5 nm as the cap layer 26. Between the underlayer 11 and the antiferromagnetic layer 12, a non-illustrated Cu film having a thickness of 100 nm (to serve as the below-mentioned word line) was provided.

The layers of the memory device were thus formed.

The subsequent processes were the same as in Example 1. The memory device of Comparative Example 2 was thus obtained.

Film Structure 4:

Ta(10)/Cu(100)/PtMn(20)/CoFe(2)/Ru(0.8)/CoFeB(2.5)/MgO(0.9)/CoFeB(2)/Cu(4)/CoFeB (2.5)/Ru(0.8)/CoFe(4)/Ru(0.8)/CoFe(2)/PtMn(20)/Ta(5) (Unit: nm)

Comparative Example 3

The laminated structure 33 including the upper intermediate layer (the nonmagnetic conductive layer 18 and the insulating layer 19) of the memory device 3 of Example 1 was replaced with a MgO film having a thickness of 0.7 nm to give a sample of Comparative Example 3. The material and thickness of each layer were as shown in the Film Structure 5 given below. That is, a Ta film having a thickness of 10 nm was employed as the underlayer 11, and a PtMn film having a thickness of 20 nm as the antiferromagnetic layer 12. A CoFe film having a thickness of 2 nm, a Ru film having a thickness of 0.8 nm, and a CoFeB film having a thickness of 2.5 nm were employed as the ferromagnetic layer 13, the nonmagnetic layer 14, and the ferromagnetic layer 15 forming the first fixed magnetic layer 31, respectively. A magnesium oxide film having a thickness of 0.9 nm was employed as the insulating layer (barrier layer) 16 to serve as a tunnel insulating layer. A CoFeB film having a thickness of 2 nm was employed as the memory layer 17, and a MgO film having a thickness of 0.7 nm was formed thereon. A CoFeB film having a thickness of 2.5 nm, a Ru film having a thickness of 0.8 nm, a CoFe film having a thickness of 4 nm, a Ru film having a thickness of 0.8 nm, and a CoFe film having a thickness of 2 nm were employed as the ferromagnetic layer 20, the nonmagnetic layer 21, the ferromagnetic layer 22, the nonmagnetic layer 23, and the ferromagnetic layer 24 forming the second fixed magnetic layer 32, respectively. A PtMn film having a thickness of 20 nm was employed as the antiferromagnetic layer 25, and a Ta film having a thickness of 5 nm as the cap layer 26. Between the underlayer 11 and the antiferromagnetic layer 12, a non-illustrated Cu film having a thickness of 100 nm (to serve as the below-mentioned word line) was provided.

The layers of the memory device were thus formed.

The subsequent processes were the same as in Example 1. The memory device of Comparative Example 3 was thus obtained.

Film Structure 5:

Ta(10)/Cu(100)/PtMn(20)/CoFe(2)/Ru(0.8)/CoFeB (2.5)/MgO(0.9)/CoFeB(2)/MgO(0.7)/CoFeB2.5)/Ru(0.8)/CoFe(4)/Ru(0.8)/CoFe(2)/PtMn(20)/Ta(5) (Unit: nm)

With respect to the obtained memory device samples of the Examples and Comparative Examples, their properties were evaluated as follows.

Measurement of Tunnel Magnetoresistance

The tunnel magnetoresistance (TMR) was measured to evaluate the resistance change ratios of the memory devices according to an embodiment.

With respect to each memory device, the external magnetic field was swept, and the magnetic-field-dependent resistance thereof was measured. Based on the resistance in the high-resistance state where the directions of the magnetizations M15 and M20 are antiparallel to each other and the resistance in the low-resistance state where the directions are parallel to each other, TMR was calculated as follows: TMR=(high resistance−low resistance)/low resistance×100.

Measurement of Reversal Current Value

The reversal current value was measured to evaluate the writing properties of the memory devices according to an embodiment.

A current with a pulse width of 10 μs to 100 ms was passed through each memory device, and the resulting resistance of the memory device was measured. Further, the amount of the current passed through the memory device was varied to determine the current value to cause magnetization reversal in the memory layer. The pulse-width dependence of such a current value was extrapolated to a pulse width of 1 ns to give the reversal current value.

Measurement of Tunnel Barrier Breakdown Voltage

The breakdown voltages of the memory devices according to an embodiment were measured for evaluation. A voltage with a pulse width of 10 μs was applied to each memory device to measure the voltage to cause dielectric breakdown in the memory device.

The test results for the samples are shown in Table 1.

TABLE 1

|  | TMR (%) | Reversal current (μA) | Breakdown voltage (V) |
| --- | --- | --- | --- |
| Example 1 | 150 | 350, −350 | 1.7 |
| Example 2 | 150 | 350, −350 | 1.7 |
| Comparative Example 1 | 160 | 400, −350 | 1.4 |
| Comparative Example 2 | 160 | 700, −550 | 1.4 |
| Comparative Example 3 | 25 | 350, −350 | 1.7 |

As shown in Table 1, Example 1 and Example 2 resulted in a reversal current of ±350 μA, a TMR of 150%, and a breakdown voltage of 1.7 V, indicating a higher balance of properties in every respect as compared with Comparative Example 1 to Comparative Example 3.

The sample of Comparative Example 1 is a tunnel magnetoresistance element of a normal single-pin structure (having one fixed magnetic layer per memory layer), and thus has a TMR as high as 160%. However, the spin injection efficiency is not as high as in the Examples, and the reversal current thereof is thus large. Further, there is only one tunnel barrier layer in the memory device, and the dielectric breakdown voltage thereof is thus also smaller than in the Examples.

The sample of Comparative Example 2 is a tunnel magnetoresistance element in which the upper intermediate layer is a Cu film and the lower intermediate layer has a dual-pin structure including a MgO film. Therefore, the TMR thereof is large as in Comparative Example 1. Further, as the dual-pin structure is effective in improving the spin injection efficiency, the reversal current thereof is almost as small as in the Examples. However, because there is only one tunnel barrier layer in the memory device, the dielectric breakdown voltage thereof is smaller than in the Examples.

The sample of Comparative Example 3 is a tunnel magnetoresistance element in which the upper intermediate layer is a MgO film and the lower intermediate layer has a dual-pin structure including a MgO film. For the efficacy in improving the spin injection efficiency, the reversal current thereof is almost as small as in the Examples. Further, for the voltage-dividing effect due to the presence of two tunnel barrier layers in the memory device, the dielectric breakdown voltage thereof is also as high as in the Examples. However, the tunnel magnetoresistance effects of the upper and lower layers cancel each other, resulting in an extremely small TMR value.

Thus, as in Example 1 and Example 2, use of a memory device according to an embodiment makes it possible to ensure a high magnetoresistance change ratio, suppress the spin injection current, and also increase the breakdown voltage of a memory device; this thus allows the formation of a memory having an excellent balance of properties.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A memory device comprising:
    a memory layer that retains information based on a magnetization state of a magnetic material,
    a first intermediate layer and a second intermediate layer that are provided to sandwich the memory layer and are each formed of an insulator,
    a first fixed magnetic layer disposed on an opposite side of the first intermediate layer from the memory layer,
    a second fixed magnetic layer disposed on an opposite side of the second intermediate layer from the memory layer, and
    a nonmagnetic conductive layer provided between either the first intermediate layer or the second intermediate layer and the memory layer,
    the memory device being configured so that spin-polarized electrons are injected thereinto in a stacking direction to change the magnetization direction of the memory layer, thereby storing information in the memory layer.

2. A memory device according to claim 1, wherein of the first intermediate layer and the second intermediate layer, the intermediate layer not provided with the nonmagnetic conductive layer is MgO.

3. A memory device according to claim 1, wherein of the first intermediate layer and the second intermediate layer, the intermediate layer not provided with the nonmagnetic conductive layer has higher tunneling resistance than that of the intermediate layer provided with the nonmagnetic conductive layer.

4. A memory device according to claim 1, wherein
the first fixed magnetic layer and the second fixed magnetic layer include ferromagnetic layers, and,
among the ferromagnetic layers, a ferromagnetic layer of the first fixed magnetic layer closest to the memory layer and a ferromagnetic layer of the second fixed magnetic layer closest to the memory layer have magnetization directions antiparallel to each other.

5. A memory device according to claim 1, wherein
at least either the first fixed magnetic layer or the second fixed magnetic layer has a laminated ferrimagnetic structure including at least two ferromagnetic layers stacked with a nonmagnetic layer therebetween.

6. A memory device according to claim 1, wherein the nonmagnetic conductive layer forms a laminated structure with either the first intermediate layer or the second intermediate layer.

7. A memory device according to claim 1, wherein the nonmagnetic conductive layer is formed of a material selected from the group consisting of Ru, Os, Re, Ir, Au, Ag, Cu, Al, Bi, B, C, Cr, Ta, Pd, Pt, Zr, Hf, W, Mo, Nb and alloys thereof.

8. A memory device according to claim 2, wherein the MgO is crystallized and maintains a crystal orientation in a 001 direction.

9. A memory device according to claim 2, wherein the thickness of the MgO intermediate layer is 1.5 nm or less.

10. A memory comprising:
a memory device including
a memory layer that retains information based on a magnetization state of a magnetic material,
a first intermediate layer and a second intermediate layer that are provided to sandwich the memory layer and are each formed of an insulator,
a first fixed magnetic layer disposed on an opposite side of the first intermediate layer from the memory layer,
a second fixed magnetic layer disposed on an opposite side of the second intermediate layer from the memory layer, and
a nonmagnetic conductive layer provided between either the first intermediate layer or the second intermediate layer and the memory layer,
the memory device being configured so that spin-polarized electrons are injected thereinto in a stacking direction to change the magnetization direction of the memory layer, thereby storing information in the memory layer; and
wires supplying current to the memory device in the stacking direction.

11. A memory according to claim 10, wherein
of the first intermediate layer and the second intermediate layer, the intermediate layer not provided with the nonmagnetic conductive layer is MgO.

12. A memory according to claim 10, wherein
of the first intermediate layer and the second intermediate layer, the intermediate layer not provided with the nonmagnetic conductive layer has higher tunneling resistance than that of the intermediate layer provided with the nonmagnetic conductive layer.

13. A memory according to claim 10, wherein
the first fixed magnetic layer and the second fixed magnetic layer include ferromagnetic layers, and,
among the ferromagnetic layers, a ferromagnetic layer of the first fixed magnetic layer closest to the memory layer and a ferromagnetic layer of the second fixed magnetic layer closest to the memory layer have magnetization directions antiparallel to each other.

14. A memory according to claim 10, wherein
at least either the first fixed magnetic layer or the second fixed magnetic layer has a laminated ferrimagnetic structure including at least two ferromagnetic layers stacked with a nonmagnetic layer therebetween.

15. A memory according to claim 10, wherein the nonmagnetic conductive layer forms a laminated structure with either the first intermediate layer or the second intermediate layer.

16. A memory according to claim 10, wherein the nonmagnetic conductive layer is formed of a material selected from the group consisting of Ru, Os, Re, Ir, Au, Ag, Cu, Al, Bi, B, C, Cr, Ta, Pd, Pt, Zr, Hf, W, Mo, Nb and alloys thereof.

17. A memory according to claim 11, wherein the MgO is crystallized and maintains a crystal orientation in a 001 direction.

18. A memory according to claim 11, wherein the thickness of the MgO intermediate layer is 1.5 nm or less.

19. A memory device comprising:
a memory layer that retains information based on a magnetization state of a magnetic material,
a first intermediate layer and a second intermediate layer that are provided to sandwich the memory layer and are each formed of an insulator,
a first fixed magnetic layer disposed on an opposite side of the first intermediate layer from the memory layer,
a second fixed magnetic layer disposed on an opposite side of the second intermediate layer from the memory layer, and
a nonmagnetic conductive layer provided either between the first intermediate layer and the first fixed magnetic layer or between the second intermediate layer and the second fixed magnetic layer,
the memory device being configured so that spin-polarized electrons are injected thereinto in a stacking direction to change the magnetization direction of the memory layer, thereby storing information in the memory layer.

20. A memory comprising:
a memory device including
a memory layer that retains information based on a magnetization state of a magnetic material,
a first intermediate layer and a second intermediate layer that are provided to sandwich the memory layer and are each formed of an insulator,
a first fixed magnetic layer disposed on an opposite side of the first intermediate layer from the memory layer,
a second fixed magnetic layer disposed on an opposite side of the second intermediate layer from the memory layer, and
a nonmagnetic conductive layer provided either between the first intermediate layer and the first fixed magnetic layer or between the second intermediate layer and the second fixed magnetic layer,
the memory device being configured so that spin-polarized electrons are injected thereinto in a stacking direction to change the magnetization direction of the memory layer, thereby storing information in the memory layer; and
wires supplying current to the memory device in the stacking direction.

* * * * *